(12) United States Patent
Li et al.

(10) Patent No.: US 10,514,390 B2
(45) Date of Patent: Dec. 24, 2019

(54) PROBE STRUCTURE

(71) Applicant: CHUNGHWA PRECISION TEST TECH. CO., LTD., Taoyuan (TW)

(72) Inventors: Wen Tsung Li, Taoyuan (TW); Kai Chieh Hsieh, Taoyuan (TW); Chih-Peng Hsieh, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 232 days.

(21) Appl. No.: 15/427,083

(22) Filed: Feb. 8, 2017

(65) Prior Publication Data
US 2018/0017593 A1    Jan. 18, 2018

(30) Foreign Application Priority Data
Jul. 13, 2016 (TW) ............... 105122085 A

(51) Int. Cl.
*G01R 1/067* (2006.01)
*G01R 31/28* (2006.01)

(52) U.S. Cl.
CPC ..... *G01R 1/06722* (2013.01); *G01R 31/2886* (2013.01)

(58) Field of Classification Search
CPC ............ G01R 1/06722; G01R 31/2886
USPC ..................... 324/755.05, 754.07
See application file for complete search history.

(56) References Cited

U.S. PATENT DOCUMENTS

| | | | |
|---|---|---|---|
| 2002/0043983 A1* | 4/2002 | Cheng ............... | G01R 1/0483 324/755.05 |
| 2002/0052155 A1* | 5/2002 | Campbell .......... | G01R 1/06722 439/824 |
| 2007/0152687 A1* | 7/2007 | Tsao .................. | G01R 1/0735 324/756.03 |
| 2007/0167022 A1* | 7/2007 | Tsai ................... | G01R 1/07371 438/712 |
| 2009/0219043 A1* | 9/2009 | Nakayama ........ | G01R 31/2889 324/762.05 |

* cited by examiner

*Primary Examiner* — Farhana A Hoque
(74) *Attorney, Agent, or Firm* — JMB Davis Ben-David

(57) ABSTRACT

A probe structure is provided, including two probe heads for electrically contacting with the two objects, respectively, an elastic buffer portion forming a hollow space therein, a conductive portion being disposed within the hollow space and thereby being surrounded by the elastic buffer portion, and having two ends respectively electrically being connected to the two probe heads. When the two probe heads do not contact with the two objects electrically, the conductive portion is linearly extended between the two probe heads.

16 Claims, 6 Drawing Sheets

PROBE STRUCTURE

CROSS-REFERENCE TO RELATED APPLICATIONS

This application claims the benefit of Taiwan Patent Application No. 105122085 filed on Jul. 13, 2016, the contents of which are incorporated herein by reference in their entirety.

BACKGROUND OF THE INVENTION

Field of Invention

The present invention relates to a probe structure, and more particularly to a probe structure, which is applicable in the semiconductor and wafer probing.

Description of Prior Art

A probe structure used in the vertical probe card for tests of semiconductor wafer or integrated chip (IC) is shown as FIGS. 1A and 1B. The probe structure of FIG. 1A is processed by three-dimensional microelectromechanical systems (MEMS), it is needed to transfer signals via a spring structure 10, for example, the spring structure 10 is fixed on a fixed point 11 with screws, the transfer path of the spring is too long to make the inductive effect be generated while transferring high frequency (speed) signals. Additionally, while transferring high current, the probe might be burned because the material of the spring is not suitable or the sectional area of the spring is too small to carry the higher current. The probe structure of FIG. 1B comprises a spring structure 10' and a probe housing 12. The probe housing 12 makes the probe structure has a bigger exterior size which is not suitable for micro pitch (less than 100 μm). The spring structure 10' is similar with the spring structure 10. Other characteristics and problem are the same as the probe structure of FIG. 1A.

Hence, it is needed to provide a probe structure, which is applicable in semiconductor wafer or IC testing, suitable for carrying large current and can prevent occurrences of inductive effects while transferring high frequency signals, to raise the ability for transmission of high frequency (speed) signal and high current.

SUMMARY OF THE INVENTION

In order to solve the technical issue of the conventional art, an objective of the present invention is to provide a probe structure, which is applicable in semiconductor wafer or IC testing, to raise the ability for transmission of high frequency (speed) signal and high current.

According to one embodiment of the present invention, a probe structure is provided, which comprises: two probe heads, in a use state, electrically connecting with two objects; an elastic buffer portion enclosing a hollow space; a conductive portion disposed within the hollow space, and surrounded by the elastic buffer portion, the conductive portion having two ends electrically connected with the two probe heads, respectively. While in an unused state, the two probe heads do not electrically contact with the two objects, and the conductive portion is linearly extended between the two probe heads.

According to the embodiment of the present invention, a portion of at least one of the probe heads is connected with the elastic buffer portion.

According to the embodiment of the present invention, the elastic buffer portion extends non-linearly within the two probe heads.

According to the embodiment of the present invention, the elastic buffer portion extends spirally within the two probe heads, to elastically stretch within the two probe heads.

According to the embodiment of the present invention, when the two probe heads electrically contact with the two objects, the conductive portion forms an elastic deformation between the two probe heads.

According to the embodiment of the present invention, the conductive portion is formed by a first soft material and a second soft material, and the first soft material is covered by the second soft material.

According to the embodiment of the present invention, the two probe heads are conductive hard metal.

According to the embodiment of the present invention, the two probe heads are made by a process of lithography and plating process or a machining process.

According to the embodiment of the present invention, the conductive portion is made by a process of lithography, plating, and etching.

According to another embodiment of the present invention, a probe structure is provided, which comprises: two probe heads, in a use state, electrically connecting with two objects; an elastic buffer portion encloses a hollow space and extends within the two probe heads with a first extending length; a conductive portion disposed within the hollow space, and surrounded by the elastic buffer portion, the conductive portion having two ends electrically connected with the two probe heads, respectively. The conductive portion extends within the two probe heads with a second extending length; the second extending length is smaller than the first extending length.

According to the embodiment of the present invention, a portion of at least one of the probe heads is connected with the elastic buffer portion.

According to the embodiment of the present invention, the elastic buffer portion extends spirally within the two probe heads, to elastically stretch within the two probe heads.

According to the embodiment of the present invention, when the two probe heads do not electrically contact with the two objects, the conductive portion is linearly extended between the two probe heads.

According to the embodiment of the present invention, when the two probe heads electrically contact with the two objects, the conductive portion forms an elastic deformation between the two probe heads.

According to the embodiment of the present invention, an extending direction of the conductive portion within the two probe heads is parallel with an extending direction of the two probe heads.

According to another embodiment of the present invention, a probe device is provided, each probe of the probe device comprises a probe structure, which comprises: two probe heads, in a use state, electrically connecting with two objects; an elastic buffer portion enclosing a hollow space; a conductive portion disposed within the hollow space, and surrounded by the elastic buffer portion, the conductive portion having two ends electrically connected with the two probe heads, respectively. While in an unused state, the two probe heads do not electrically contact with the two objects, and the conductive portion is linearly extended between the two probe heads.

According to the embodiment of the present invention, a portion of at least one of the probe heads is connected with the elastic buffer portion.

According to the embodiment of the present invention, the elastic buffer portion extends non-linearly within the two probe heads.

According to the embodiment of the present invention, the elastic buffer portion extends spirally within the two probe heads, to elastically stretch within the two probe heads.

According to the embodiment of the present invention, when the two probe heads electrically contact with the two objects, the conductive portion forms an elastic deformation between the two probe heads.

According to the embodiment of the present invention, the conductive portion is formed by a first soft material and a second soft material, and the first soft material is covered by the second soft material.

According to the embodiment of the present invention, the two probe heads are conductive hard metal.

According to the embodiment of the present invention, the two probe heads are made by a process of lithography and plating process or a machining process.

According to the embodiment of the present invention, the conductive portion is made by a process of lithography, plating, and etching.

According to another embodiment of the present invention, a probe device is provided, each probe of the probe device comprises a probe structure, which comprises: two probe heads, in a use state, electrically connecting with two objects; an elastic buffer portion encloses a hollow space and extends within the two probe heads with a first extending length; a conductive portion disposed within the hollow space, and surrounded by the elastic buffer portion, the conductive portion having two ends electrically connected with the two probe heads, respectively. The conductive portion extends within the two probe heads with a second extending length; the second extending length is smaller than the first extending length.

According to the embodiment of the present invention, a portion of at least one of the probe heads is connected with the elastic buffer portion.

According to the embodiment of the present invention, the elastic buffer portion extends spirally within the two probe heads, to elastically stretch within the two probe heads.

According to the embodiment of the present invention, when the two probe heads do not electrically contact with the two objects, the conductive portion is linearly extended between the two probe heads.

According to the embodiment of the present invention, when the two probe heads electrically contact with the two objects, the conductive portion forms an elastic deformation between the two probe heads.

According to the embodiment of the present invention, an extending direction of the conductive portion within the two probe heads is parallel with an extending direction of the two probe heads.

With comparison with the conventional art, the present invention can only takes the elastic portion for buffering and the conductive portion for transferring signal, instead of taking the spring portion as the transferring path of current, hence, it is able to provide an area with higher load-current for large current test, moreover, the transferring path is reduced by not taking the spring as the transferring path of current, which can prevent occurrences of inductive effects while transferring high frequency signals, and is suitable for transmission of high frequency (speed) test.

DETAILED DESCRIPTION OF THE PREFERRED EMBODIMENTS

In order to make the objectives, technical proposals and advantages of the present invention be much clear, below is further detailed description accompanying with the drawings to the embodiment of the present application.

Figure 1A:
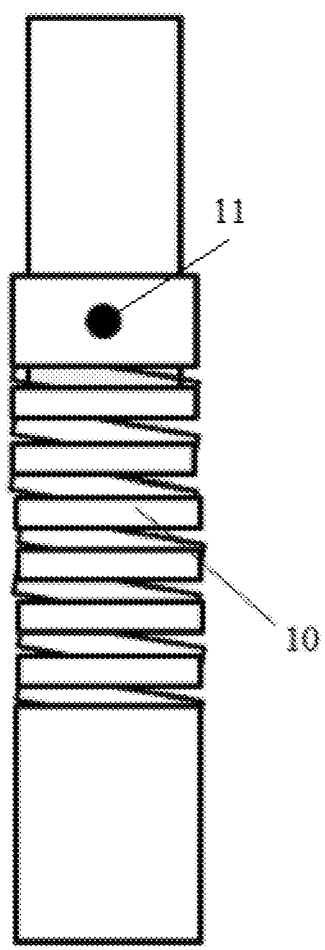
FIG. 1A depicts a conventional probe structure.
Figure 1B:
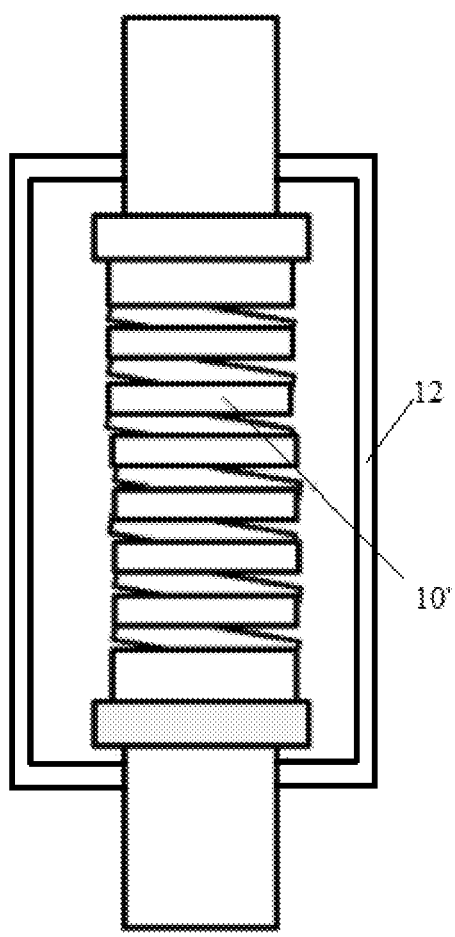
FIG. 1B depicts another conventional probe structure.
Figure 2A:
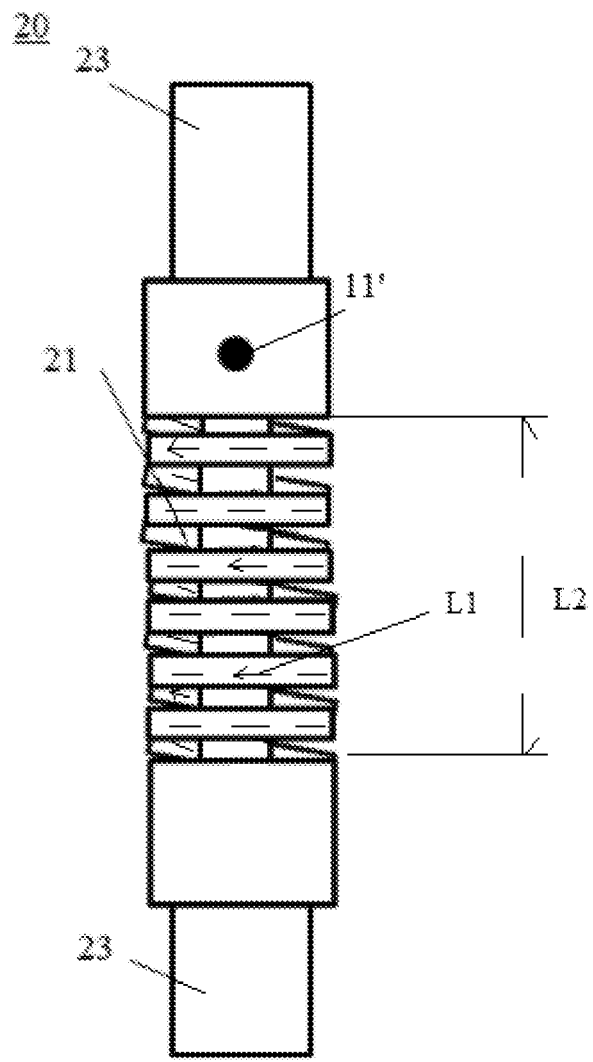
FIG. 2A depicts an illustrative front view of a probe structure according to one embodiment of the present invention.
Figure 2B:
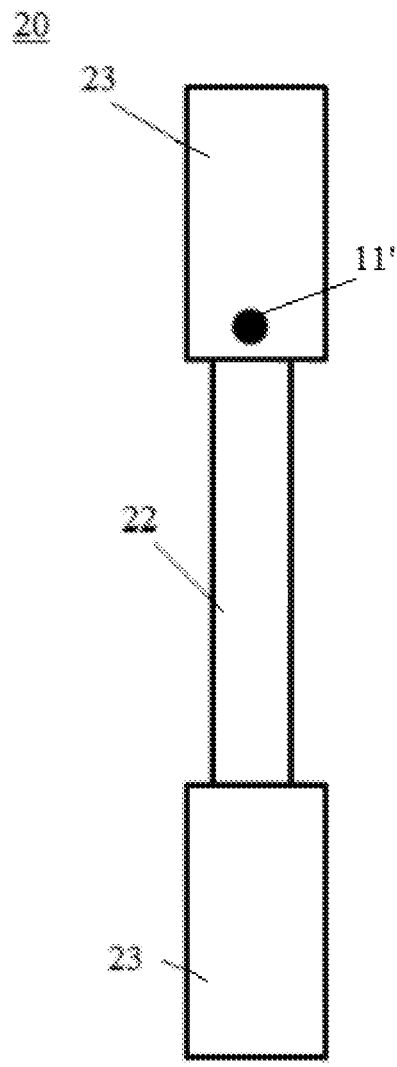
FIG. 2B depicts an illustrative front view without an elastic buffer portion of FIG. 2A.

Please refer to FIGS. 2A and 2B, one preferred embodiment of the present invention provides a probe structure 20, which is applicable in semiconductor wafer or IC testing, to raise the ability for transmission of high frequency (speed) signal and high current. The probe structure 20 of the present invention comprises two probe heads 23, in use state, are electrically connected with two objects (IC or wafer . . . ); an elastic buffer portion 21 encloses a hollow space, to extend within the two probe heads 23 with a first extending length L1; a conductive portion 22 is disposed within the hollow space and is surrounded by the elastic buffer portion 21, and has two ends are respectively electrically connected with the two probe heads 23, to extend within the two probe heads 23 with a second extending length L2. Preferably, the conductive portion 22 can be a cylindrical structure, but does not limit the present invention. When in an unused state, the two probe heads 23 do not electrically contact with the two objects, the conductive portion 22 is linearly extended between the two probe heads 23.

Preferably, a portion of at least one of the probe heads 23 is connected with the elastic buffer portion 21, and the elastic buffer portion 21 extends non-linearly within the two probe heads 23. In the embodiment, the elastic buffer portion 21 is an extendable elastic element. For example, the elastic buffer portion 21 is a spiral spring fixed on a specific position (such as the fixed point 11') of any one of the probe heads 23 with screws. With micro spring machining process to make the elastic buffer portion 21 extends spirally within the two probe heads 23. In use state, the two probe heads 23 electrically contact with the two objects, the conductive portion 21 can perform an elastic stretch between the two probe heads 23, in other words, the amplitude of the extrusion is taken as the reciprocated stroke for test. The spiral path of the elastic buffer portion 21 (spiral spring) is a first extending length L1.

In the probe structure of the embodiment, in use state, the two probe heads 23 electrically contact with the two objects, the current's transmission is transferred via the conductive portion 22 instead of the spiral path of elastic buffer portion 21 (spiral spring), hence, the conduction path between the two probe heads 23 is a second extending length L2 which is linearly extended within the two probe heads 23. Because the second extending length L2 is a vertical and linear (straight line) extending length, the second extending length L2 will far smaller than the first extending length L1 (the spiral path of the spiral spring), the inductive effect decreased and the cylinder cross-area of the conductive portion 22 is bigger, which is able to carry larger current.

Figure 2C:
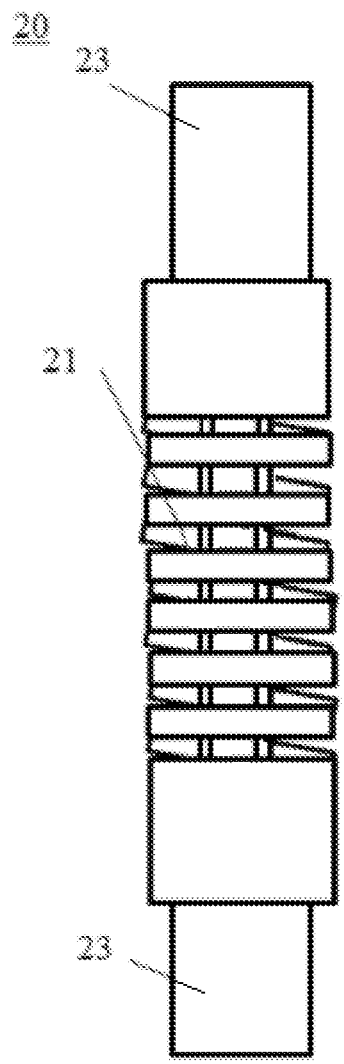
FIG. 2C depicts an illustrative side view of the probe structure of FIG. 2A.
Figure 2D:
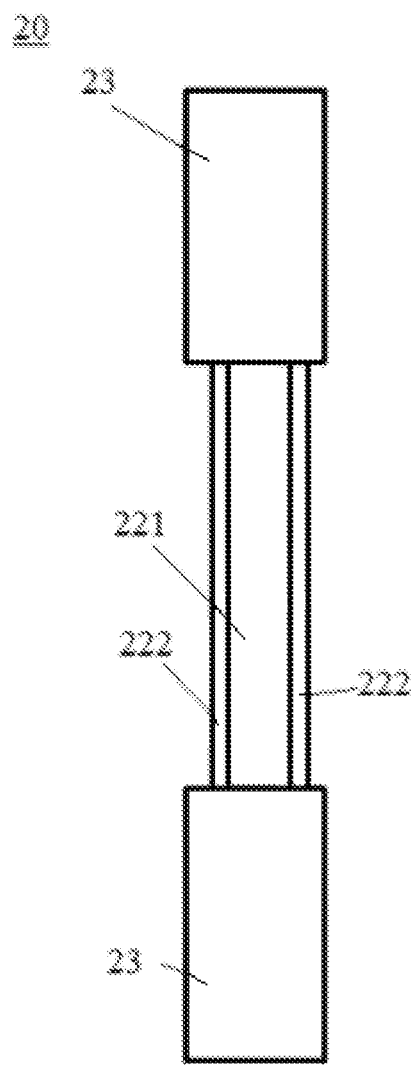
FIG. 2D depicts an illustrative side view of the probe structure of FIG. 2B.

Please further refer to FIGS. 2C and 2D, FIG. 2C depicts an illustrative side view of the probe structure 20 of FIG. 2A, FIG. 2D depicts an illustrative side view of the probe structure 20 of FIG. 2B. Preferably, the conductive portion 22 is formed by a first soft material 221 which is disposed at inner layer and a second soft material 222 which is disposed at outer layer, in other words, the first soft material 221 is covered by the second soft material 222. The conductive portion 22 is made by a process of lithography, plating, and etching, the conductive portion 22 can be cut by desired dimension. For the soft characteristic of the first soft material 221 and the second soft material 222, when the two probe heads 23 electrically contact with the two objects, the elastic buffer portion 21 forms an elastic deformation by suffering an extrusion, the conductive portion 22 can deform accordingly without effecting the transferring quality. Where, the first soft material 221 and the second soft material 222 can be formed by any of polyester-based polymer, styrene-based polymer, cellulose-based polymer, polyethersulfone-based polymer, polycarbonate-based polymer, acrylic polymer, polyolefinic polymer, polyamide-based polymer, polyimide-based polymer, sulfone-based polymer, polyethersulfone-based polymer, polyether ether kotone-based polymer, polyphenylene sulfide-based polymer, vinyl alcohol-based polymer, vinylidene chloride-based polymer, vinyl butyral-based polymer, acrylate-based polymer, polyoxymethylene-based polymer, epoxy-based polymer, polyethylene terephthalate (PET), Polyethylene Naphthalate (PEN), polysiloxane, and Polyamic acid (PAA).

Figure 3:
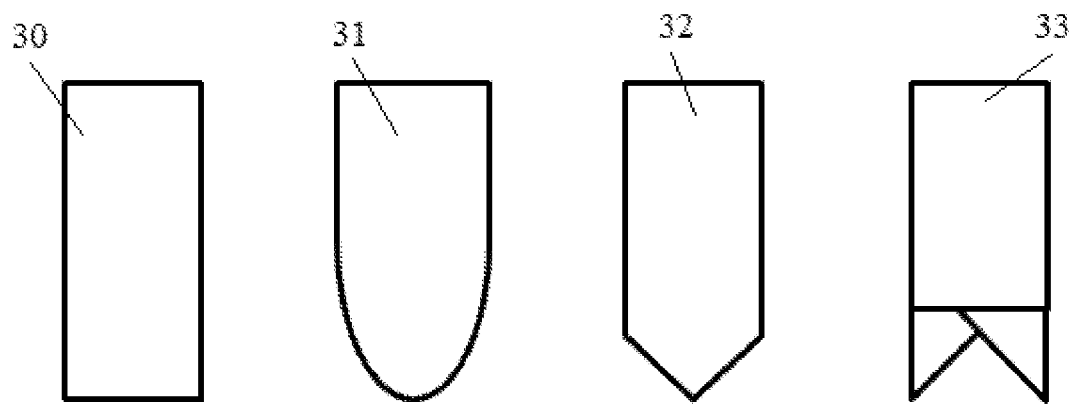
FIG. 3 depicts illustrative views of a plurality of usable shapes selectively installed in a probe head of the probe structure according to one embodiment of the present invention.

Preferably, the two probe heads 23 are conductive hard metal, the two probe heads 23 are made by a process of lithography and plating process or a machining process. It is able to make the two probe heads 23 as the desired shape according to the actual quests. FIG. 3 depicts illustrative side views of a plurality of usable shapes selectively installed in a probe head 23 of the probe structure 20 according to one embodiment of the present invention. The probe head 23 can be cylinder or cuboid. The types of FIG. 3 are: flat head probe 30, round head probe 31, pointed head probe 32, paw head probe 33.

Besides the conductive portion 22 of the probe structure 20 of FIGS. 2A-2D are vertical extending lengths (such as straight line), in the other embodiments of the present invention, the elastic buffer portion 21 can be designed as tilt extending length (tilt line) or non-linear extending length (such as curved extending length). Only if the inside of the elastic buffer portion 21 forms a hollow space and extends within the two probe heads 23 with a first extending length L1, and the conductive portion 22 extends within the two probe heads 23 with a second extending length L2, the second extending length L2 is smaller than the first extending length L1, which are enclosed within the present invention.

Additionally, the embodiments of the present invention can be setup on the probe device of the tests of wafer and semiconductor, the probe head 23 of the probe device 20 and the conductive portion 22 can be rotatively fixed via a screw nut structure, latch structure, or welding process, and the first soft material 221 and the second soft material 222 can be tightly contacted with each other or have a gap.

In comparison with the conventional art, the present invention can only takes the elastic portion for buffering and the conductive portion for transferring signal, instead of taking the spring portion as the transferring path of current, hence, it is able to provide an area with higher load-current for large current test. Moreover, the transferring path is reduced by not taking the spring as the transferring path of current, which can prevent occurrences of inductive effects while transferring high frequency signals, and is suitable for transmission of high frequency (speed) test.

The above are only preferred embodiments of the present invention, which are not intended to limit the present invention. Any modifications, equivalent replacements or improvement within the spirit and principles of the present invention should be included within the scope of protection of the present invention.

What is claimed is:

1. A probe structure, comprising:
   two probe heads, in a use state, electrically connecting with two objects;
   an elastic buffer portion enclosing a hollow space;
   a conductive portion disposed within the hollow space, and surrounded by the elastic buffer portion, the conductive portion having two ends electrically connected with the two probe heads, respectively;
   wherein in an unused state, the two probe heads do not electrically contact with the two objects, and the conductive portion is linearly extended between the two probe heads, and
   wherein the conductive portion is formed by a first soft material and a second soft material, and the first soft material is covered by the second soft material to have an interface between the first soft material and the second soft material.

2. The probe structure according to claim 1, wherein a portion of at least one of the probe heads is connected with the elastic buffer portion.

3. The probe structure according to claim 2, wherein the conductive portion is made by a process of lithography, plating, and etching.

4. The probe structure according to claim 1, wherein the elastic buffer portion extends non-linearly within the two probe heads.

5. The probe structure according to claim 4, wherein the elastic buffer portion extends spirally within the two probe heads, to elastically stretch between the two probe heads.

6. The probe structure according to claim 4, wherein when the two probe heads electrically contact with the two objects, the conductive portion forms an elastic deformation between the two probe heads.

7. The probe structure according to claim 1, wherein the two probe heads are conductive hard metal.

8. The probe structure according to claim 1, wherein the two probe heads are made by a lithographic process and a plating process or a machining process.

9. A probe device, each probe of the probe device comprises the probe structure of claim 1.

10. A probe structure, comprising:
    two probe heads, in a use state, electrically connecting with two objects;
    an elastic buffer portion enclosing a hollow space and extending within the two probe heads with a first extending length; and
    a conductive portion disposed within the hollow space, and surrounded by the elastic buffer portion, the conductive portion having two ends electrically connected with the two probe heads, respectively;
    wherein the conductive portion extends within the two probe heads with a second extending length, the second extending length is smaller than the first extending length, and wherein the conductive portion is formed by a first soft material and a second soft material, and the first soft material is covered by the second soft material to have an interface between the first soft material and the second soft material.

11. The probe structure according to claim 10, wherein a portion of at least one of the probe heads is connected with the elastic buffer portion.

12. The probe structure according to claim 10, wherein the elastic buffer portion extends spirally within the two probe heads, to elastically stretch within the two probe heads.

13. The probe structure according to claim 12, wherein when the two probe heads electrically contact with the two objects, the conductive portion forms an elastic deformation between the two probe heads.

14. The probe structure according to claim 10, wherein when the two probe heads do not electrically contact with the two objects, the conductive portion is linearly extended between the two probe heads.

15. The probe structure according to claim 10, wherein an extending direction of the conductive portion within the two probe heads is parallel with an extending direction of the two probe heads.

16. A probe device, each probe of the probe device comprises the probe structure of claim 10.

\* \* \* \* \*